United States Patent
Vaysse et al.

(10) Patent No.: US 9,671,477 B2
(45) Date of Patent: Jun. 6, 2017

(54) INDUCTIVE SENSOR FOR A MOTOR VEHICLE, COMPRISING ELECTRIC OSCILLATORS DESIGNED TO FORM AN AC VOLTAGE AT THE TERMINALS OF A FIELD COIL BY MEANS OF ELECTRIC RESONANCE

(71) Applicants: CONTINENTAL AUTOMOTIVE FRANCE, Toulouse (FR); CONTINENTAL AUTOMOTIVE GmbH, Hannover (DE)

(72) Inventors: Bertrand Vaysse, Tournefeuille (FR); Alain Fontanet, Muret (FR); Jeremie Blanc, Toulouse (FR); Jean-Louis Roux, Brax (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 614 days.

(21) Appl. No.: 14/083,753

(22) Filed: Nov. 19, 2013

(65) Prior Publication Data

US 2014/0139217 A1    May 22, 2014

(30) Foreign Application Priority Data

Nov. 19, 2012   (FR) ..................... 12 60951

(51) Int. Cl.
*G01R 33/06*   (2006.01)
*G01V 3/00*   (2006.01)
(Continued)

(52) U.S. Cl.
CPC ....... *G01R 33/34046* (2013.01); *G01D 5/204* (2013.01)

(58) Field of Classification Search
CPC .................. G01R 33/34046; G01D 5/204
(Continued)

(56) References Cited

U.S. PATENT DOCUMENTS 5,027,066 A    6/1991   Reder
6,166,535 A *  12/2000  Irle .................. G01D 5/204
                                              324/207.12
(Continued)

FOREIGN PATENT DOCUMENTS

CN           1848600 A      10/2006
DE        39 03 278 A1       8/1990
(Continued)

OTHER PUBLICATIONS

French Search Report, dated Jul. 8, 2013, from corresponding French application.

*Primary Examiner* — Farhana Hoque
(74) *Attorney, Agent, or Firm* — Young & Thompson

(57) ABSTRACT

An inductive sensor (100) for a motor vehicle, includes:
  a field coil (101) designed to form an electromagnetic field,
  a coil (103) for measuring a magnetic field and designed to provide an output signal representative of the position of a metal target (102) in the magnetic field formed by the field coil (101), and
  at least two electric circuits (111) connected simultaneously in parallel to the terminals of the field coil (101), each electric circuit (111) including an inverter element (112) and a capacitive element (113), and forming, together with the field coil (101) an electric oscillator (110) designed to form an AC voltage at the terminals of the field coil (10) via electric resonance, the electric oscillators (110) being of the same resonance frequency.

15 Claims, 2 Drawing Sheets

(51) Int. Cl.
*G01R 31/02* (2006.01)
*G01R 33/34* (2006.01)
*G01D 5/20* (2006.01)

(58) Field of Classification Search
USPC .......................... 324/207.15, 251, 318, 537
See application file for complete search history.

(56) References Cited

U.S. PATENT DOCUMENTS

2004/0017205 A1* 1/2004 Sievers .................. G01R 35/00
    324/522
2006/0227579 A1    10/2006 Glauser
2011/0298444 A1* 12/2011 Pratt ........................ H03F 3/72
    324/76.11

FOREIGN PATENT DOCUMENTS

DE     197 38 834 A1     3/1999
JP     2005 043111 A     2/2005

* cited by examiner

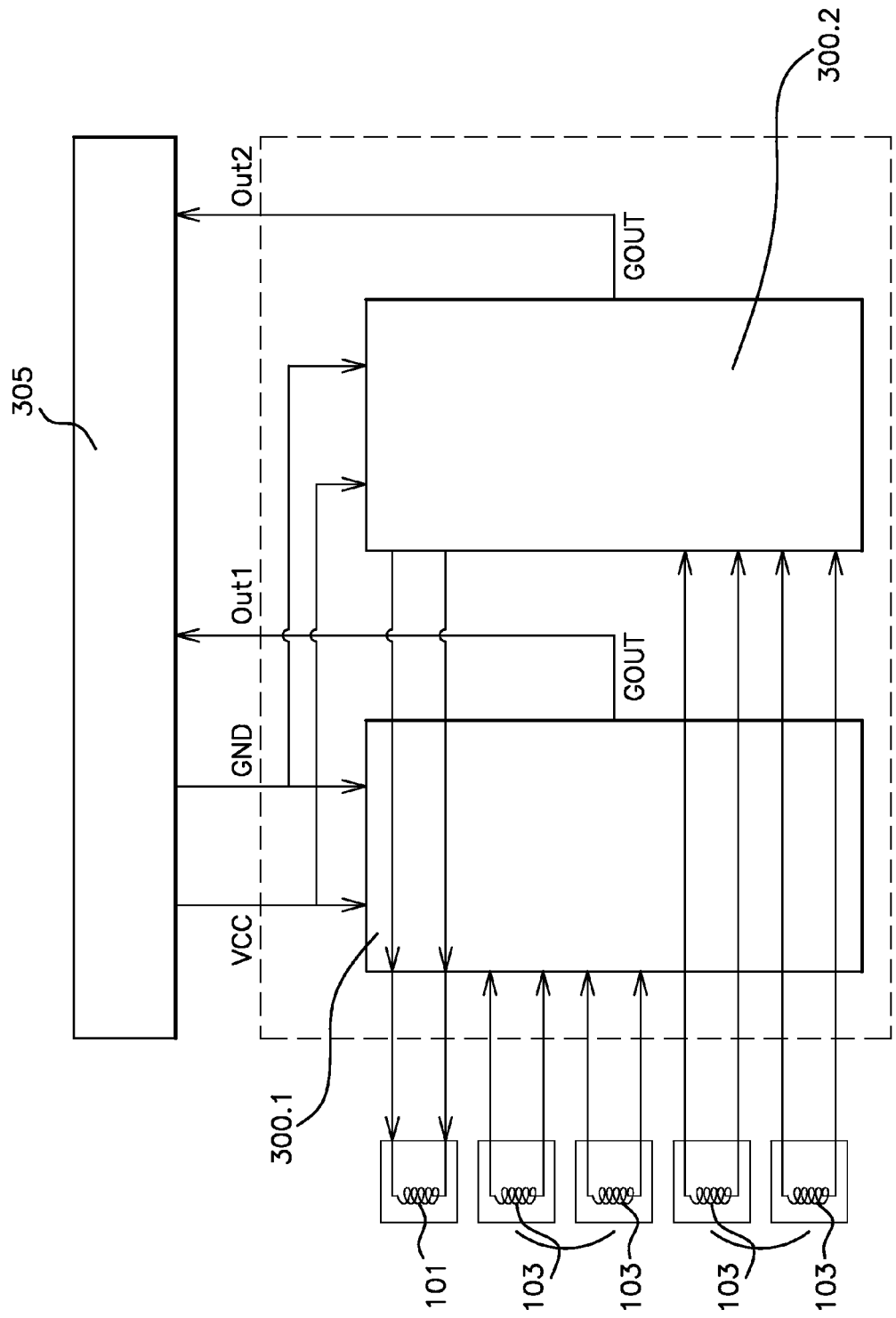

INDUCTIVE SENSOR FOR A MOTOR VEHICLE, COMPRISING ELECTRIC OSCILLATORS DESIGNED TO FORM AN AC VOLTAGE AT THE TERMINALS OF A FIELD COIL BY MEANS OF ELECTRIC RESONANCE

FIELD OF THE INVENTION

The invention relates to the field of position sensors. The invention more specifically relates to an inductive sensor comprising a field coil designed to form a magnetic field and also comprising a coil for measuring a magnetic field and designed to provide an output signal representative of the position of a metal target in the magnetic field formed by the field coil.

The invention is more specifically, but not exclusively, designed for the field of measurements of the angular or linear position of metal targets of motor vehicles.

BACKGROUND OF THE INVENTION

To form a magnetic field, the field coil of an inductive sensor is supplied with AC voltage by a power circuit.

In inductive sensors in modern motor vehicles, the power circuit is present in the form of an H-shaped bridge connected to an electric source. The switches of the H-shaped bridge are controlled so as to circulate in the field coil an electric current circulating alternatively in one direction, then in the opposite direction.

So as to improve the reliability of the functioning of modern inductive sensors, it is known to provide a plurality of power circuits each comprising an H-shaped bridge. Said power circuits cannot be connected in parallel to the terminals of the electric source since this would be at risk of being short-circuited. Consequently, at any given moment, a single power circuit is active and connected to the field coil, the other power circuits then being passive and disconnected from said field coil.

If the power circuit connected to the field coil becomes faulty, it is disconnected from said field coil and another power circuit is connected to the field coil.

However, the detection of the fault of the power circuit connected to the field coil is not instantaneous. Consequently, no position measurement can be taken between the moment at which the power circuit connected to the field coil becomes faulty and the moment at which another power circuit is connected to the field coil.

It is understood that such an unavailability of the inductive sensor may prove bothersome if the position measurement taken by said inductive sensor is significant for the functioning of the motor vehicle.

In particular, the object of the invention is to solve this problem.

SUMMARY OF THE INVENTION

To this end, the invention relates to an inductive sensor of a motor vehicle, comprising:
  a field coil designed to form an electromagnetic field,
  a coil for measuring a magnetic field, said coil being designed to provide an output signal representative of the position of a metal target in the magnetic field formed by the field coil,
  characterized in that it comprises at least two electric circuits connected simultaneously in parallel to the terminals of the field coil, each electric circuit comprising an inverter element and a capacitive element, and forming, together with said field coil, an electric oscillator designed to form an AC voltage at the terminals of said field coil by means of electric resonance, said electric oscillators being of the same resonance frequency.

The invention can be implemented in accordance with the advantageous embodiments presented hereinafter, which can be considered individually or in any technically feasible combination.

The inverter element is advantageously an inverter logic gate.

The inverter element is advantageously an amplifier/inverter assembly.

The value of the resonance frequency is advantageously between two megahertz and six megahertz.

The two electric circuits are advantageously integrated in two different integrated circuits.

Each of said two integrated circuits is advantageously designed to determine a piece of information concerning the position of the metal target according to output signals received from one or more measuring coils.

The two integrated circuits are advantageously connected to different respective measuring coils.

Should an electric circuit become faulty, said electric circuit is advantageously designed to stop functioning, whereas the other electric circuit is designed to continue functioning without interruption.

The invention also relates to a motor vehicle comprising an inductive sensor.

BRIEF DESCRIPTION OF THE DRAWINGS

The invention will be better understood upon reading the following description, provided merely by way of example and given with reference to the figures, in which:
FIG. 3: shows a schematic view of an inductive sensor according to an exemplary embodiment of the invention.

DETAILED DESCRIPTION OF THE INVENTION

In these figures, identical references between figures denote identical or similar elements. For reasons of clarity, the elements shown are not to scale, unless stated otherwise.

Figure 1:
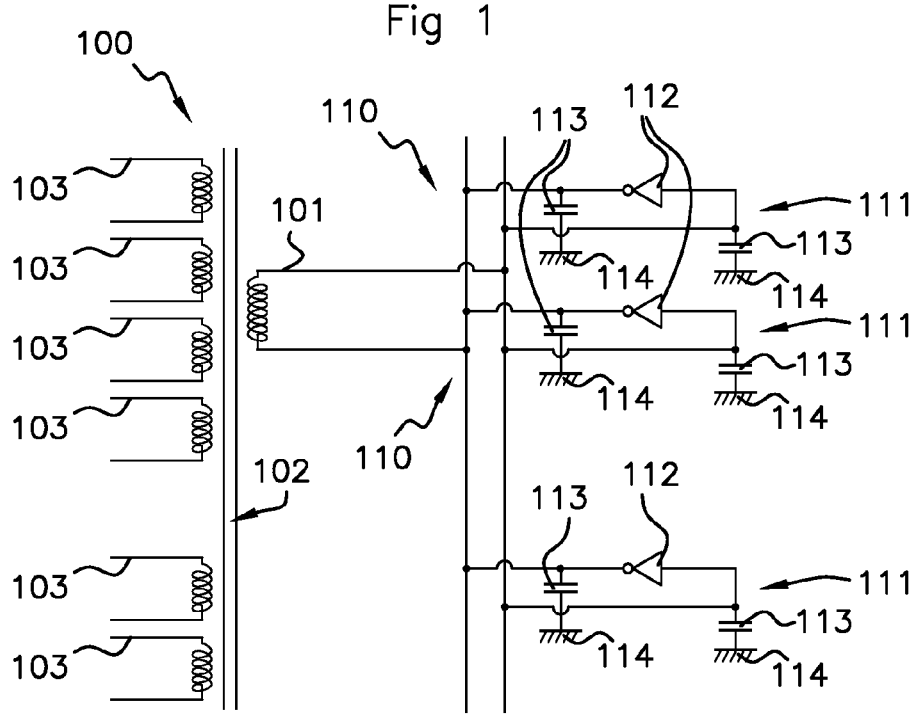
FIG. 1: shows a schematic view of an inductive sensor according to an exemplary embodiment of the invention.

FIG. 1 shows an inductive position sensor 100, for example positioned in a motor vehicle, for measuring the position of a moving metal target 102. In an example, said target 102 is part of a gear-change lever, a pedal, or a throttle valve. The sensor 100 comprises a field coil 101 designed to form an electromagnetic field and a plurality of coils 103 for measuring an electromagnetic field and designed to provide an output signal representative of the position of the target 102.

The sensor 100 further comprises at least two electric circuits 111 connected simultaneously in parallel to the terminals of the field coil 101. Each electric circuit 111, together with the field coil 101, forms an electric oscillator 110 designed to form an AC voltage at the terminals of said field coil 101 by means of electric resonance. Each electric circuit 111 comprises at least one inverter element 112 and at least one capacitive element 113. In an exemplary embodiment, the inverter element 112 takes the form of an inverter logic gate or an amplifier/inverter assembly.

Figure 2A:
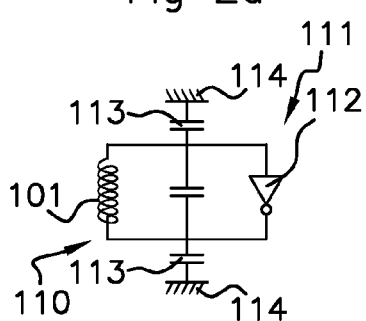
FIGS. 2a-2d: show schematic views of oscillators of inductive sensors according to exemplary embodiments of the invention.
Figure 2B:
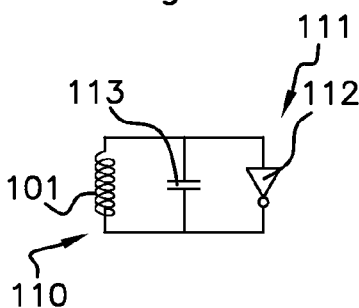
Figure 2C:
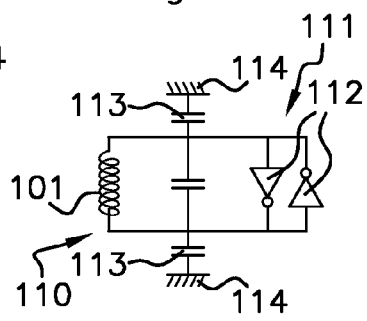
Figure 2D:
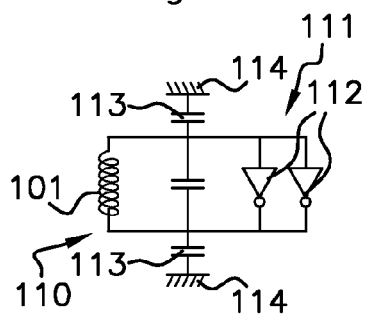

In a preferred embodiment, each electric circuit 111 comprises two capacitive elements 113 and an inverter element 112. The inverter element 112 is connected in parallel to the field coil 101. A first terminal of the first capacitive element 113 is connected to a first terminal of the field coil 101 and a second terminal of the first capacitive element 113 is connected to the electric ground 114. In addition, a first terminal of the second capacitive element 113 is connected to a second terminal of the field coil 101 and a second terminal of the second capacitive element 113 is connected to the electric ground 114 (see FIGS. 1 and 2a). In a variant, each electric circuit 111 further comprises a second inverter element 112 connected in parallel to the field coil 101, either in the same direction or in the opposite direction compared to the first inverter element 112 (see FIGS. 2c and 2d). In a variant, each electric circuit 111 comprises a single capacitive element 113 connected in parallel to the field coil 101 and to the inverter element 112 (see FIG. 2b).

In an exemplary embodiment, the sensor 100 comprises two electric circuits 111. The first inverter element 112 of the first electric circuit 111 is integrated in a first integrated circuit 300.1 and the second inverter element 112 of the second electric circuit 111 is integrated in a second integrated circuit 300.2 (see FIG. 3). Each integrated circuit 300.1, 300.2 is connected to the terminals of the field coil 101. The first integrated circuit 300.1 is also connected to two measuring coils 103 and to a control circuit 305. Likewise, the second integrated circuit 300.2 is also connected to two other measuring coils 103 and to said control circuit 305. The control circuit 305 provides the same electric power to the two integrated circuits 300.1, 300.2. The integrated circuits 300.1, 300.2 are identical and originate from the same manufacturer, and therefore the likelihood of failure of each integrated circuit 300.1, 300.2 is not statistically independent.

In one embodiment, the inverter element 112 creates oscillations and a condition of instability for each electric circuit 111. In fact, the gain of said inverter element 112 is unitary and said inverter element 112 is out of phase by 180 degrees, which compensates for the phase difference of the field coil 101.

The oscillations created then maintained by each inverter element 112 are synchronized with one another by means of electric resonance thanks to the capacitive elements 113 of all the electric circuits 111 and to the field coil 101. The oscillations then have a frequency referred to as a resonance frequency. The value of the resonance frequency depends on the capacitive elements 113 and the field coil 101. The value of the resonance frequency is between approximately one hundred kilohertz and several megahertz. The oscillations created by the electric circuit 111 are substantially sinusoidal with a weak harmonic content. In an example, the value of the resonance frequency is between two megahertz and six megahertz.

The oscillations created by each inverter element 112 are maintained by the capacitive elements 113 and the field coil 101, which provide energy. The oscillations are therefore free, and are not dependent on the frequency of an exciting voltage.

The two electric circuits 111 thus form an AC voltage at the terminals of the field coil 101. The two oscillators 110 thus function simultaneously. Each electric circuit 111 thus transmits a signal to the control circuit 305, said signal corresponding to the information concerning simultaneous function.

The field coil 101 forms a high-frequency sinusoidal electromagnetic field oscillating at the resonance frequency of the oscillations created by the oscillators 110.

The position of the target 102 develops according to a position or an angle to be measured. The positioning of the target 102 modifies the electromagnetic field created by the field coil 101.

The measuring coils 103 measure the electromagnetic field created by the field coil 101 and modified by the positioning of the target 102. Each measuring coil 103 thus provides an output signal to the integrated circuit 300.1, 300.2 associated with said measuring coil 103, said output signal corresponding to the measured electromagnetic field and thus being representative of the position of the mechanical target 102. Each integrated circuit 300.1, 300.2 thus receives two output signals corresponding to the electromagnetic field measured by two different measuring coils 103. Each integrated circuit 300.1, 300.2 combines the output signals originating from the measuring coils 103 to determine information concerning the position of the target 102. According to other examples, each integrated circuit 300.1, 300.2 could be connected only to one measuring coil 103, each piece of position-related information then only being determined on the basis of one output signal. Each integrated circuit 300.1, 300.2 then transmits the position-related information to the control circuit 305, which then determines the angle or the position of the target 102 by a conventional method, for example by means of graphs combining possible values of position-related information with respective values of the position of the target 102. The number of pieces of position-related information received by the control circuit 305, which is greater than or equal to two, makes it possible to provide redundancy in applications where operational reliability is important, since, if one of the integrated circuits 300.1, 300.2 is faulty, a piece of position-related information can still be received from the other integrated circuit.

Should an electric circuit 111 become faulty, said electric circuit 111 stops functioning, whereas the other electric circuit 111 continues to function without interruption. The oscillations are therefore produced continuously, even if an electric circuit 111 is faulty. The reasons why functioning may stop include, for example, a rebooting of the associated integrated circuit 300.1, 300.2, a destroyed connection between said integrated circuit 300.1, 300.2 and the field coil 101, a state of diagnosis of said integrated circuit 300.1, 300.2, or a power-down of said integrated circuit 300.1, 300.2.

Should the common electric supply to the two integrated circuits 300.1, 300.2, provided by the control circuit 305, become faulty, the two integrated circuits 300.1, 300.2 no longer function and no longer produce signals, in accordance with technical safety requirements.

Should the field coil 101 become faulty, the two integrated circuits 300.1, 300.2 are in a diagnosis state, which indicates a malfunction of the sensor 100.

In a variant, the number of electric circuits 111, and therefore the number of integrated circuits, is greater than two.

The invention claimed is:
1. An inductive sensor for a motor vehicle, comprising:
a field coil designed to form an electromagnetic field, at least one measuring coil for measuring a magnetic field and designed to provide an output signal representative of the position of a metal target in the magnetic field formed by the field coil, at least two electric circuits connected simultaneously in parallel to the terminals of the field coil, each electric circuit comprising an inverter element and a capacitive element, and forming, together with said field coil, an electric oscillator designed to form an AC voltage at the terminals of said field coil by means of electric resonance, said electric oscillators being of the same resonance frequency, and functioning simultaneously, a first inverter element of a first electric circuit is integrated in a first integrated circuit, a second inverter element of a second electric circuit integrated in a second integrated circuit, each integrated circuit is connected to the terminals of the field coil, the first integrated circuit is connected to two measuring coils and to a control circuit, the second integrated circuit is connected to two other measuring coils and to the control circuit, and each electric circuit transmits a signal to the control circuit, said signal corresponding to the information concerning simultaneous function of the electric oscillators.

2. The sensor according to claim 1, wherein the inverter element is an inverter logic gate.

3. The sensor according to claim 2, wherein the resonance frequency value is between two megahertz and six megahertz.

4. The sensor according to claim 2, wherein the resonance frequency value is between two megahertz and six megahertz.

5. The sensor according to claim 4, wherein each of said two integrated circuits is designed to determine information concerning the position of the metal target according to output signals received from one or more measuring coils.

6. The sensor according to claim 1, wherein the inverter element is an inverter/amplifier assembly.

7. The sensor according to claim 6, wherein the resonance frequency value is between two megahertz and six megahertz.

8. The sensor according to claim 6, characterized in that the resonance frequency value is between two megahertz and six megahertz.

9. The sensor according to claim 8, wherein each of said two integrated circuits is designed to determine information concerning the position of the metal target according to output signals received from one or more measuring coils.

10. The sensor according to claim 1, wherein the resonance frequency value is between two megahertz and six megahertz.

11. The sensor according to claim 10 wherein each of said two integrated circuits is designed to determine information concerning the position of the metal target according to output signals received from one or more measuring coils.

12. The sensor according to claim 1, wherein, should an electric circuit become faulty, said electric circuit is designed to stop functioning, whereas the other electric circuit is designed to continue functioning without interruption.

13. The sensor according to claim 10, wherein the resonance frequency value is between two megahertz and six megahertz.

14. The sensor according to claim 13, wherein each of said two integrated circuits is designed to determine information concerning the position of the metal target according to output signals received from one or more measuring coils.

15. A motor vehicle comprising the inductive sensor according to claim 1.

* * * * *

UNITED STATES PATENT AND TRADEMARK OFFICE
CERTIFICATE OF CORRECTION

PATENT NO. : 9,671,477 B2
APPLICATION NO. : 14/083753
DATED : June 6, 2017
INVENTOR(S) : Bertrand Vaysse et al.

It is certified that error appears in the above-identified patent and that said Letters Patent is hereby corrected as shown below:

On the Title Page

Below the Abstract, delete "15 Claims, 2 Drawing Sheets" and replace with --11 Claims, 2 Drawing Sheets--.

In the Claims

Column 4, Line 66-Column 6, Line 35, (approx.), should read:
LISTING OF CLAIMS:
1. An inductive sensor for a motor vehicle, comprising: a field coil designed to form an electromagnetic field,
   at least one measuring coil for measuring a magnetic field and designed to provide an output signal representative of the position of a metal target in the magnetic field formed by the field coil,
   at least two electric circuits connected simultaneously in parallel to the terminals of the field coil, each electric circuit comprising an inverter element and a capacitive element, and forming, together with said field coil, an electric oscillator designed to form an AC voltage at the terminals of said field coil by means of electric resonance, said electric oscillators being of the same resonance frequency, and functioning simultaneously,
   a first inverter element of a first electric circuit is integrated in a first integrated circuit,
   a second inverter element of a second electric circuit integrated in a second integrated circuit,
   each integrated circuit is connected to the terminals of the field coil,
   the first integrated circuit is connected to two measuring coils and to a control circuit,
   the second integrated circuit is connected to two other measuring coils and to the control circuit, and
   each electric circuit transmits a signal to the control circuit, said signal corresponding to the information concerning simultaneous function of the electric oscillators.
2. The sensor according to claim 1, wherein the inverter element is an inverter logic gate.
3. The sensor according to claim 2, wherein the resonance frequency value is between two megahertz and six megahertz.

Signed and Sealed this
Twenty-eighth Day of April, 2020

Andrei Iancu
*Director of the United States Patent and Trademark Office*

4. The sensor according to claim 3, wherein each of said two integrated circuits is designed to determine information concerning the position of the metal target according to output signals received from one or more measuring coils.

5. The sensor according to claim 1, wherein the inverter element is an inverter/amplifier assembly.

6. The sensor according to claim 5, wherein the resonance frequency value is between two megahertz and six megahertz.

7. The sensor according to claim 6, wherein each of said two integrated circuits is designed to determine information concerning the position of the metal target according to output signals received from one or more measuring coils.

8. The sensor according to claim 1, wherein the resonance frequency value is between two megahertz and six megahertz.

9. The sensor according to claim 8 wherein each of said two integrated circuits is designed to determine information concerning the position of the metal target according to output signals received from one or more measuring coils.

10. The sensor according to claim 1, wherein, should an electric circuit become faulty, said electric circuit is designed to stop functioning, whereas the other electric circuit is designed to continue functioning without interruption.

11. A motor vehicle comprising the inductive sensor according to claim 1.